United States Patent
Goto

(10) Patent No.: US 7,687,761 B2
(45) Date of Patent: Mar. 30, 2010

(54) PHOTOELECTRIC CONVERSION DEVICE PROVIDING EFFICIENT READ-OUT OF SIGNAL CHARGES

(75) Inventor: Takashi Goto, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 12/332,890

(22) Filed: Dec. 11, 2008

(65) Prior Publication Data

US 2009/0152439 A1  Jun. 18, 2009

(30) Foreign Application Priority Data

Dec. 14, 2007  (JP) .............................. 2007-323481

(51) Int. Cl.
*H01L 31/00* (2006.01)
*H01L 31/10* (2006.01)

(52) U.S. Cl. ..................................... 250/214.1; 257/431

(58) Field of Classification Search .............. 250/214.1; 257/431

See application file for complete search history.

(56) References Cited

U.S. PATENT DOCUMENTS

| 5,965,875 A | 10/1999 | Merrill |
| 2007/0228503 A1* | 10/2007 | Yokoyama ................. 257/431 |

FOREIGN PATENT DOCUMENTS

| JP | 2002-502120 A | 1/2002 |
| JP | 2002-83946 A | 3/2002 |
| JP | 2002-513145 A | 5/2002 |

\* cited by examiner

*Primary Examiner*—Seung C Sohn
(74) *Attorney, Agent, or Firm*—Birch, Stewart, Kolasch & Birch, LLP

(57) ABSTRACT

An organic photoelectric conversion device is provided and includes: an organic photoelectric conversion layer that performs photoelectric conversion of incident light and generates a signal charge; a first electrode provided on one side of the organic photoelectric conversion layer and a plurality of second electrodes arranged on the other side of the organic photoelectric conversion layer. A gap between adjacent pair of the second electrodes is 3 μm or below.

4 Claims, 5 Drawing Sheets

PHOTOELECTRIC CONVERSION DEVICE PROVIDING EFFICIENT READ-OUT OF SIGNAL CHARGES

This application is based on and claims priority under 35 U.S.C. §119 from Japanese Patent Application No. 2007-323481 filed Dec. 14, 2007, the entire disclosure of which is herein incorporated by reference.

BACKGROUND OF THE INVENTION

1. Field of the Invention

The present invention relates to an organic photoelectric conversion device having an organic photoelectric conversion layer that performs photoelectric conversion of incident light and generates signal charges.

2. Description of Related Art

Each of single-plate image sensors currently in use, notably CCD image sensors and CMOS image sensors, has three or four kinds of color filters in mosaic pattern on an array of pixels capable of performing photoelectric conversion (photodiodes), and produces outputs of color signals corresponding to its respective color filters. The outputs of color signals produced are formed into color images by undergoing signal processing. However, when color filters installed in mosaic pattern in an imaging device are filters of primary colors, about two-thirds of incident light is absorbed by color filters, accordingly there is a drawback that light utilization is inefficient and sensitivity is low. In addition, since color signals of only one color are obtained from each of pixels, resolution is low. In particular, false colors are noticeable.

In order to overcome those drawbacks, the imaging device as disclosed, e.g., in JP-T-2002-513145 has so far been developed. In the case of such an imaging device, triply stacked wells provided for light signal detection (photodiodes) in a silicon substrate deliver signals having different spectral sensitivities in response to their respective depths in the silicon substrate (signals having their individual peaks in the blue, green and red wavelength regions in the order of increasing distance from the surface). Although that device shows improvements in resolution and utilization efficiency of light, it has also drawbacks that color reproducibility is poor because of insufficiency in separation of spectral sensitivity characteristics of RGB output signals and S/N is degraded by addition and subtraction of output signals performed for obtaining true RGB signals. Therefore, as disclosed in JP-T-2002-502120 and JP-A-2002-083946, the imaging devices capable of achieving further improved separation of spectral sensitivity characteristics of RGB output signals have been researched and developed. Such imaging devices are imaging devices of three-photoelectric conversion layer structure, such as pixel structure made up of stacked photoelectric conversion layers generating signal charges in response to B light, G light and R light, respectively, in increasing order of distance from the incident plane of light and besides, each of them is provided integrally with a readout section which, on a pixel basis, can independently read signal charge optically generated in each photoelectric conversion layer. Therefore, in the case of such image pickup devices, incident light is subjected to photoelectric conversion and read, so utilization efficiency of visible light is close to 100%, and what's more, every pixel can deliver color signals of three colors R, G and B. Further, spectral sensitivity characteristics of three-layer photoelectric conversion layers can be chosen in isolation from one another, so separation of spectral sensitivity characteristics of ROB output signals is good. Thus, images of good color reproducibility and high S/N can be obtained in high sensitivity and high resolution (in inconspicuous false colors).

In the solid-state image pickup devices using organic photoelectric conversion layers disclosed in JP-T-2002-502120 and JP-A-2002-083946, pixel electrodes are built in a state that each pixel is partitioned, and thereon an organic photoelectric conversion layer and a counter electrode are stacked and shared by all pixels. Herein, field intensity is smaller on the gap between adjacent pixel electrodes than on each pixel electrode, so there is a problem that it takes time before signal charges generated in the gap come to be read, accordingly image lags occur.

SUMMARY OF THE INVENTION

An object of the present invention is to provide an organic photoelectric conversion device, which can ensure efficient readout of signal charges and can prevent image lags from occurring.

As a result of intensive study, the present inventor has found that occurrence of image lags can be reduced to a practically insignificant level by controlling a gap between adjacent pixel electrodes to a specified size or below. More specifically, the objective of the invention can be achieved by the following (1) to (4).

(1) An organic photoelectric conversion device including:
an organic photoelectric conversion layer that performs photoelectric conversion of incident light and generates signal charges;
a first electrode provided on one side of the organic photoelectric conversion layer,
and a plurality of second electrodes arranged on the other side of the organic photoelectric conversion layer,
wherein a gap between adjacent pair of the second electrodes is 3 μm or below.

(2) The organic photoelectric conversion device as described in (1), wherein the first electrode is configured as a single counter electrode having optical transparency.

(3) The organic photoelectric conversion device as described in (1) or (2), wherein the plurality of second electrodes are pixel electrodes arranged corresponding to respective pixel regions.

(4) The organic photoelectric conversion device as described in any one of (1) to (3), wherein the second electrodes are connected to a readout circuit for reading signal charges and transmitting them to an output section.

BRIEF DESCRIPTION OF THE DRAWINGS

The features of the invention will appear more fully upon consideration of the exemplary embodiments of the inventions, which are schematically set forth in the drawings, in which.

DETAILED DESCRIPTION OF THE EXEMPLARY EMBODIMENTS

According to an exemplary embodiment of the invention, an organic photoelectric conversion device that allows efficient readout of signal charges and prevention of image lags can be obtained.

Exemplary embodiment of the invention will be described below in detail on the basis of drawings.

Figure 1:
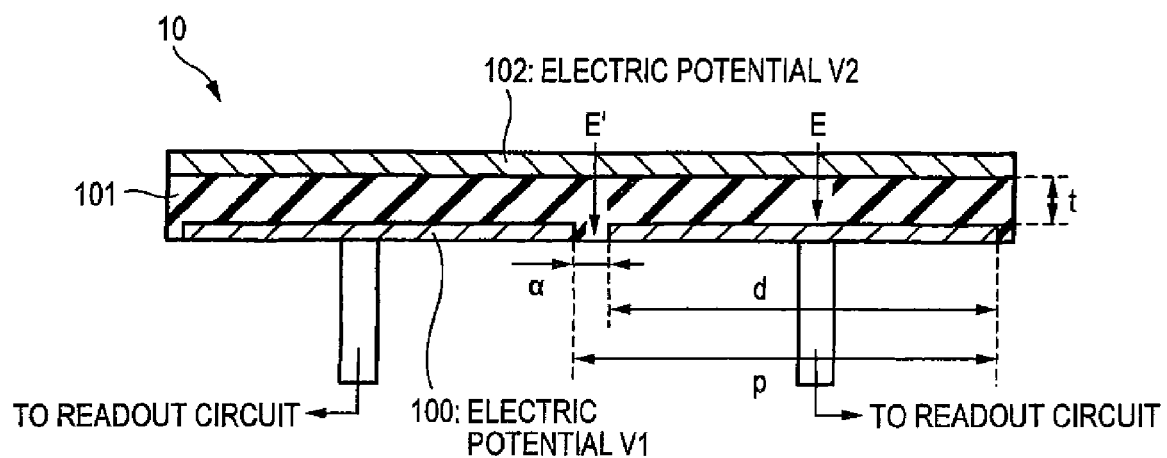
FIG. 1 is a cross-sectional diagram showing a schematic structure of an organic photoelectric conversion device.
Figure 2:
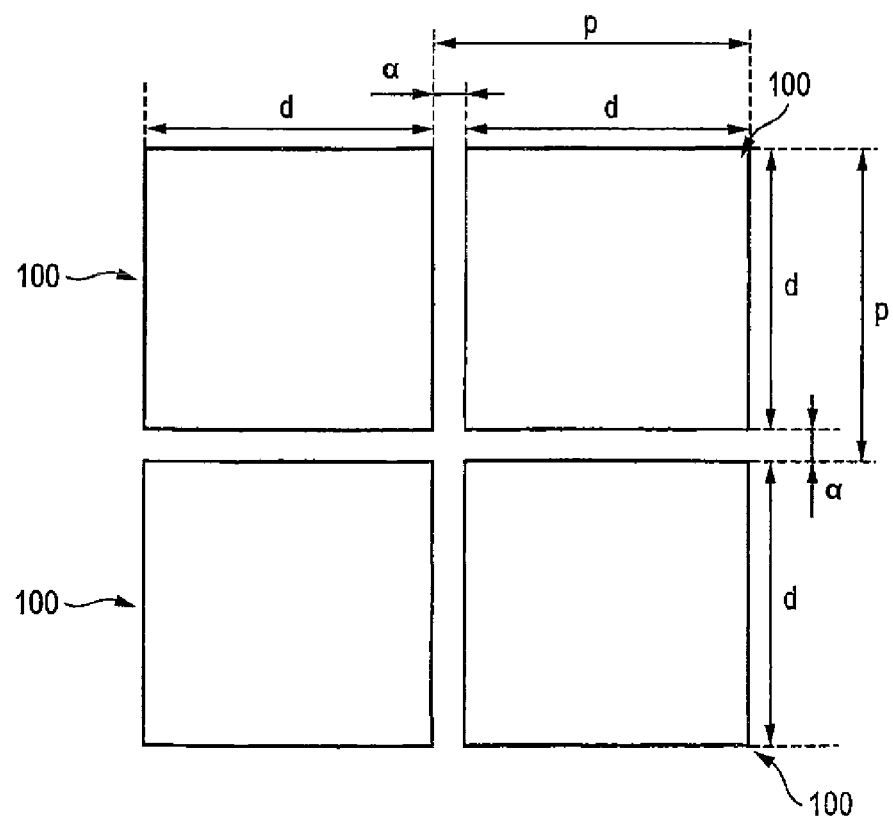
FIG. 2 is a plan view showing a configuration of pixel electrodes.

FIG. 1 is a cross-sectional diagram showing the schematic structure of an organic photoelectric conversion device according to an exemplary embodiment. FIG. 2 is a plan view showing a configuration of pixel electrodes. As shown in FIG. 1, an organic photoelectric conversion device 10 has an organic photoelectric conversion layer 101 that performs photoelectric conversion of incident light and generates signal charges. On one side of the organic photoelectric conversion layer 101, a counter electrode 102 is provided, and on the other side a plurality of pixel electrodes 100 are provided. The device 10 according to this exemplary embodiment is configured to apply incident light to the organic photoelectric conversion layer 101 from the upper side in the diagram and to read signal charges generated in the organic photoelectric conversion layer 101 from the underside of the organic photoelectric conversion layer 101. Incidentally, the pixel electrodes 100 and the counter electrode 102 have no particular restrictions so long as they can generate an electric field inside the organic photoelectric conversion layer 101 at the time of imaging, and a first electrode can be provided on one side of the organic photoelectric conversion layer 101 and an array with a plurality of second electrodes can be provided on the other side.

A pixel has a triple-layer structure built up of the counter electrode 102, the organic photoelectric conversion layer 101 and one pixel electrode 100.

The counter electrode 102 is constructed from an electrode material transparent to light, has the form of film shared by all pixel regions, and is configures as a single member. The counter electrode 102 is connected electrically to a voltage supply unit which is not shown in the diagram and, at the time of imaging, a voltage is applied thereto so that the electrode potential is set at V2. The counter electrode 102 is constructed from a material having optical transparency or low absorbency of light, such as a metallic compound like ITO or a very thin metal film.

In a two-dimensional plane parallel to the counter electrode 102, the pixel electrodes 100 are formed on a pixel basis in isolation from each other with a specified space between every adjacent pair of pixel electrodes 100. Each pixel electrode 100 is constructed from a conductive material such as a metal or a metallic compound. As shown in FIG. 2, each pixel electrode 100 has a shape close to a square when viewed from the upper side. Incidentally, the peripheral border of each pixel electrode 100 may be tapered off when required.

The organic photoelectric conversion layer 101 is constructed from an organic material that, when irradiated with light, generates signal charges trough photoelectric conversion in response to the incident light. In the organic photoelectric conversion layer 101, a blocking layer which can prevent passage of positive holes or electrons and a positive hole- or electron-transporting layer may be formed as required. For the organic photoelectric conversion layer 101, a material having an intrinsic spectral sensitivity, such as merocyanine, phthalocyanine, 4H-pyran or quinacridone, can be used. In this illustrative embodiment, the organic photoelectric conversion layer 101 is formed into the shape of one sheet shared by all pixels.

Either electrons or holes (positive holes) may be used as the signal charges. It is preferable to use carriers having high mobility. In this illustrative embodiment, holes are used as signal charges.

Each pixel electrode 100 is connected electrically to a readout circuit, wherein signal charges are read at charge-readout time and transmitted to an output section, via a wiring layer, a plug or so on. The readout circuit can be configured to equip a semiconductor board with MOS transistors. Alternatively, either a charge transport-and-output system using charge-coupled devices, or a current output system using thin-film transistors, or the like may be applied to the readout circuit. The organic photoelectric conversion device concerned in the invention can achieve the effects described hereafter irrespective of makeup of the readout circuit.

In this illustrative embodiment, as shown in FIG. 1 and FIG. 2, α designates a gap between every adjacent pair of pixel electrodes 100, d a width of each pixel electrode 100 (a length of one side in the periphery when the electrode has the form of a square as in this illustrative embodiment), p a pitch in an array of pixel electrodes 100, and t a thickness of the organic photoelectric conversion layer 101. In addition, E designates an electric field on each pixel electrode 100 in the organic photoelectric conversion layer 101, and E' an electric field in the gap between adjacent pixel electrodes 100. Further, the mobility of signal charges in the organic photoelectric conversion layer 101 is represented as u. Incidentally, the electric fields E and E' can be expressed by the following equations, respectively.

$$E = \frac{V2 - V1}{t}$$

$$E' = \frac{V2 - V1}{\sqrt{\frac{\alpha^2}{4} + t^2}}$$

The time, τ, required for migration of carriers in the organic photoelectric conversion layer 101 is generally expressed by the following equation as a function of the carrier mobility, u, in the organic photoelectric conversion layer 101. Herein, l designates a migration length and E an electric field strength.

$$\tau = \frac{l}{uE}$$

Consequently, the time, T1, required for carriers generated right above each pixel electrode 100, and that in proximity to the counter electrode, to arrive at the pixel electrode right opposite is expressed by the following equation.

$$T1 = \frac{t}{uE} = \frac{t^2}{u(V1-V2)}$$

On the other hand, the time, T2, required for signal charges generated in the portion of the topmost surface of the organic photoelectric conversion layer 101, which faces the center of each gap (a place of weakest electric field strength), to arrive at their nearest pixel electrode 100 is expressed by the following equation.

$$T2 = \frac{\frac{\alpha^2}{4} + t^2}{u(V2-V1)}$$

In order to avoid occurrence of image lags, both T1 and T2 are required to be shorter than a period, T, of one frame. If the relation T2<T rather than the relation T1<T2 is satisfied, occurrence of image lags is avoided.

When T is taken as 33 msec, V2−V1 as 10V, the mobility u in the organic photoelectric conversion layer 101 as $1\times10^{-6}$ cm$^2$/V·sec and t as 200 nm, no image lag occurs theoretically so long as the relation α<10 μm is satisfied.

However, the study done by the present inventor has shown that the result as indicated by the theory was not obtained when an organic photoelectric conversion device 10 was actually fabricated, and image lags still occurred if the gap a was not further lessened. As a cause for this discrepancy, it is supposed that, in the organic photoelectric conversion layer 101, carriers exhibit a behavior that cannot be expressed in the foregoing equations.

Therefore, the present inventor has conducted the following experiments in order to check the extents to which image lags occur in organic photoelectric conversion devices when the makeup of each device is modified.

Figure 3:
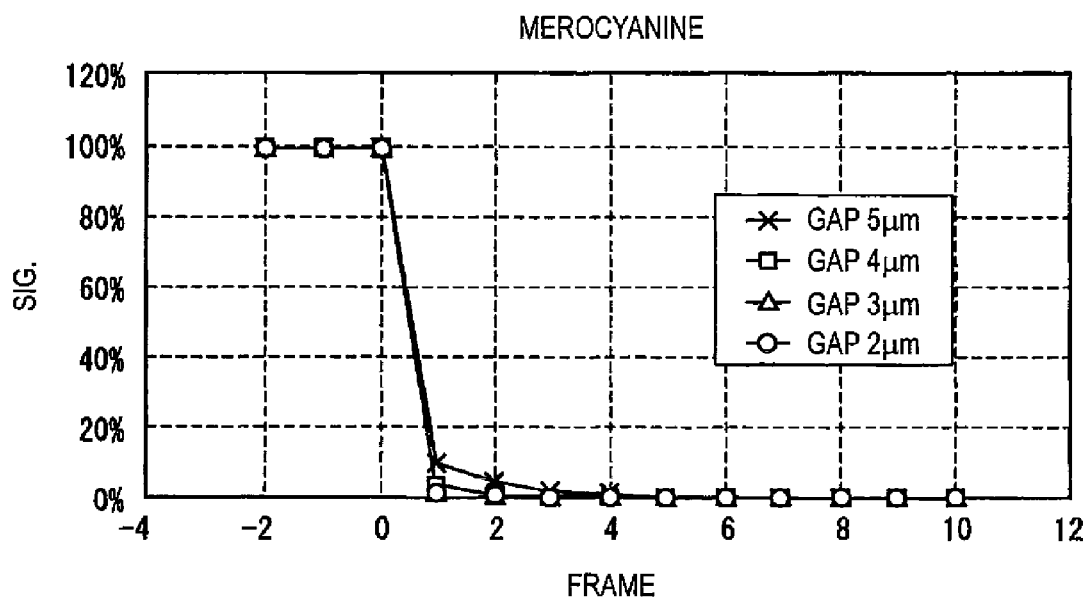
FIG. 3 is a graph showing proportions of image lags occurring at shutoff time in organic photoelectric conversion devices using merocyanine as the photoelectric conversion material of the respective organic photoelectric conversion layers.
Figure 4:
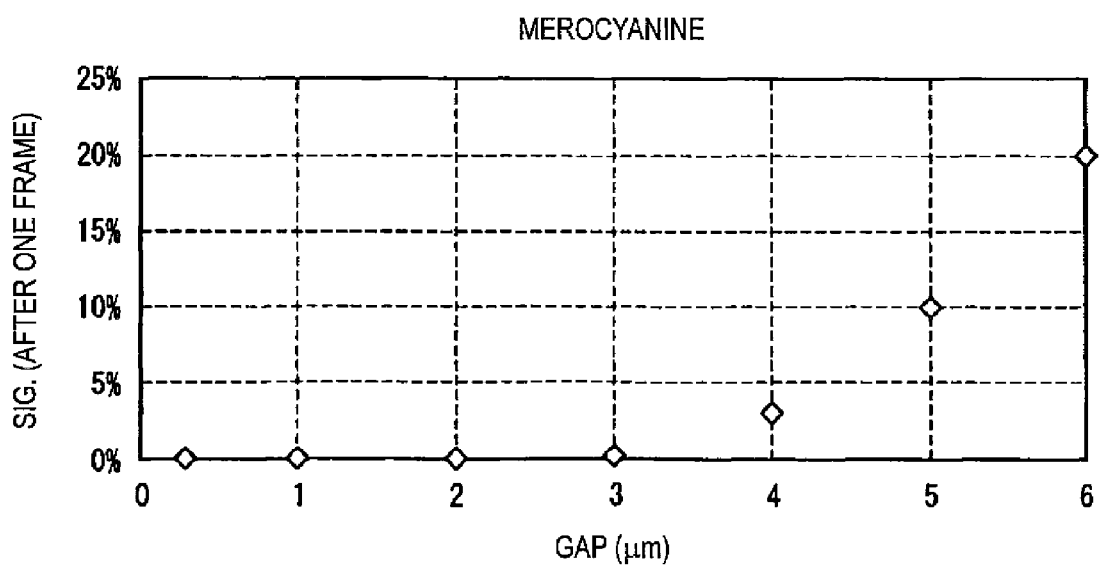
FIG. 4 is a graph showing proportions of image-lag occurrences after one frame in the organic photoelectric conversion devices varying in gap as shown on FIG. 3.
Figure 5:
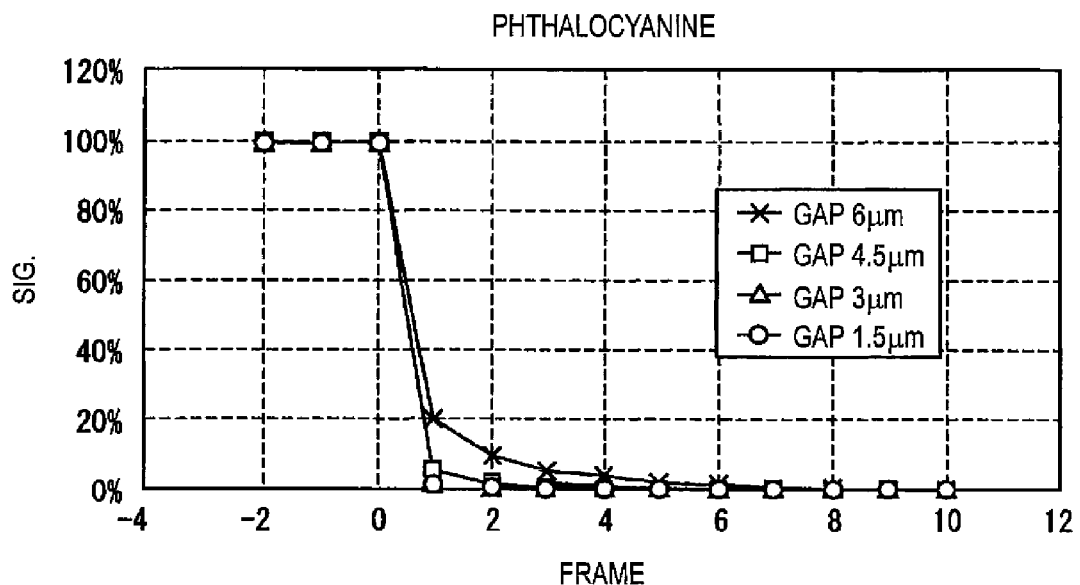
FIG. 5 is a graph showing proportions of image lags occurring at shutoff time in organic photoelectric conversion devices using phthalocyanine as the photoelectric conversion material of the respective organic photoelectric conversion layers.
Figure 6:
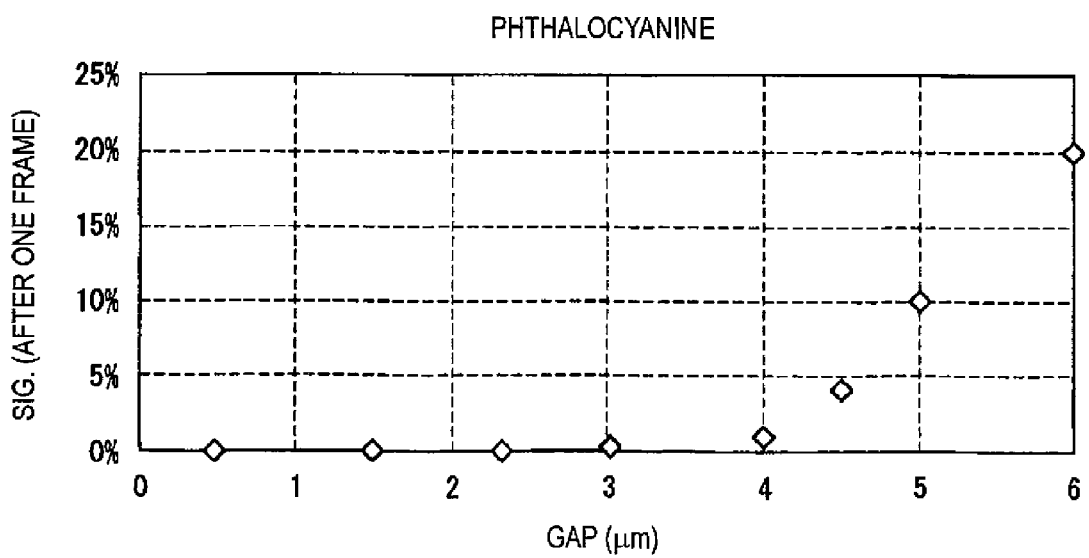
FIG. 6 is a graph showing proportions of image-lag occurrences after one frame in the organic photoelectric conversion devices varying in gap as shown on FIG. 5.
Figure 7:
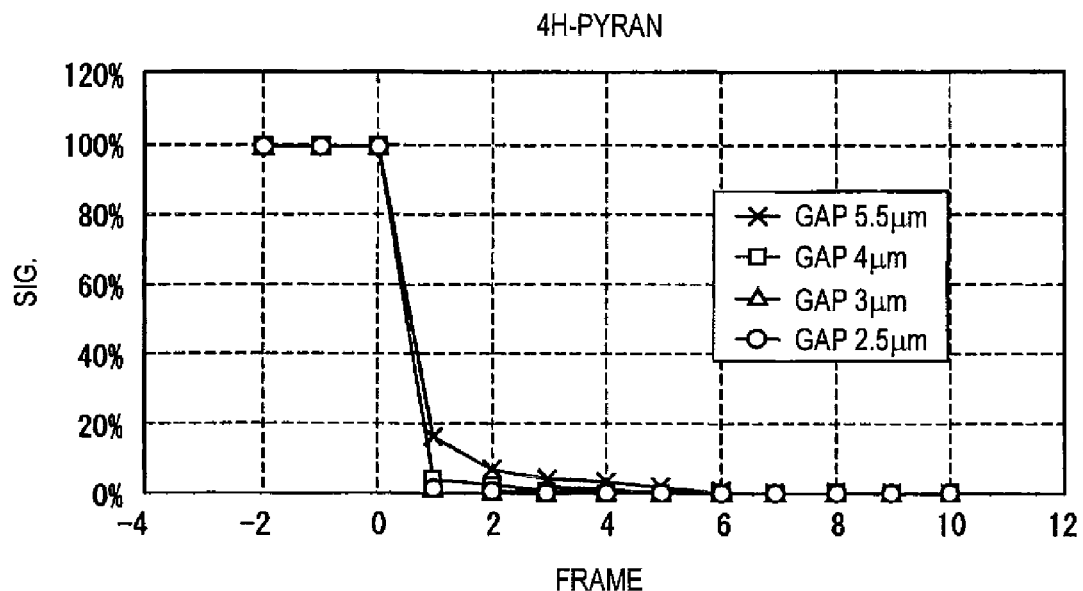
FIG. 7 is a graph showing proportions of image lags occurring at shutoff time in organic photoelectric conversion devices using 4H-pyran as the photoelectric conversion material of the respective organic photoelectric conversion layers.
Figure 8:
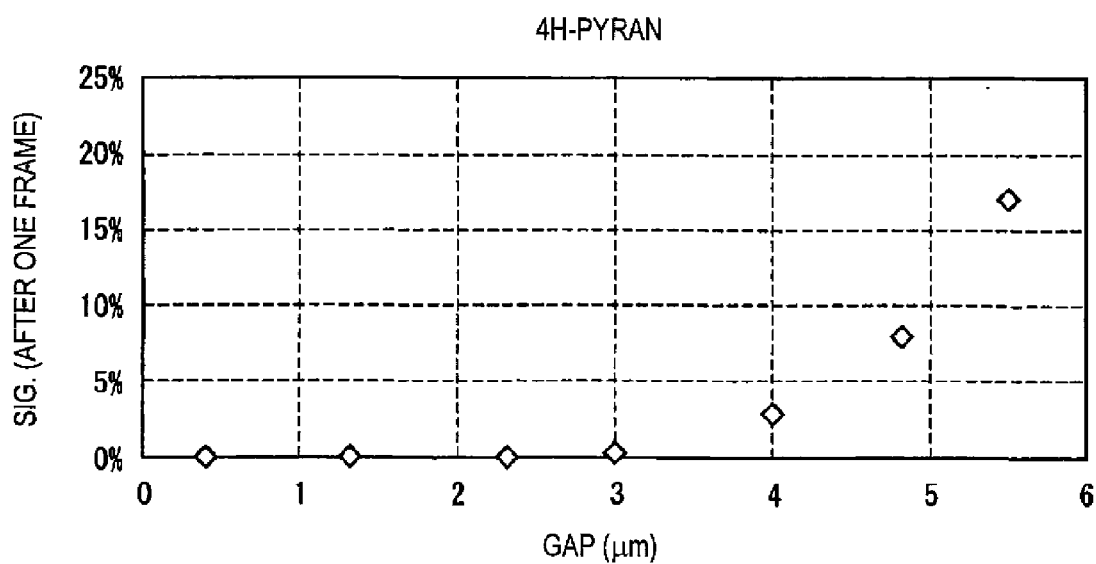
FIG. 8 is a graph showing proportions of image-lag occurrences after one frame in the organic photoelectric conversion devices varying in gap as shown on FIG. 7.

FIG. 3 is a graph showing proportions of image-lag occurrences at shutoff time in organic photoelectric conversion devices wherein merocyanine is used as the photoelectric conversion material of the respective organic photoelectric conversion layers. FIG. 4 is a graph showing proportions of image-lag occurrences after one frame in the organic photoelectric conversion devices varying in gap as shown on FIG. 3. FIG. 5 is a graph showing proportions of image-lag occurrences in organic photoelectric conversion devices wherein phthalocyanine is used as the photoelectric conversion material of the respective organic photoelectric conversion layers. FIG. 6 is a graph showing proportions of image-lag occurrences after one frame in the organic photoelectric conversion devices varying in gap as shown on FIG. 5. FIG. 7 is a graph showing proportions of image-lag occurrences in organic photoelectric conversion devices wherein 4H-pyran is used as the photoelectric conversion material of the respective organic photoelectric conversion layers. FIG. 8 is a graph showing proportions of image-lag occurrences after one frame in the organic photoelectric conversion devices varying in gap as shown on FIG. 7. In each of the graphs shown in FIGS. 3, 5 and 7, the proportion of image lag (Sig. %) occurring in relation to the frame number is plotted as ordinate and the frame number as abscissa. Herein, a light source is shut off in synchronization with the zeroth frame (head frame) at the time of measurements made on each photoelectric conversion device. In each of the graphs shown in FIGS. 4, 6 and 8, on the other hand, the proportion of image lag (Sig. %) occurring after one frame is plotted as ordinate and the size of the gap (μm) as abscissa.

The extents of image-lag occurrences in the organic photoelectric conversion devices as shown in FIG. 3 wherein settings on the gap between adjacent pixel electrodes are changed to 5 μm, 4 μm, 3 μm and 2 μm, respectively, are compared to one another. It is apparent from these comparisons that image-lag occurrence is perceived on the 1st to 3rd frames in the cases of setting the gap at 5 μm and 4 μm, respectively, but in the cases of setting the gap at 3 μm and 2 μm, respectively, image-lag occurrence can be reduced to a practically insignificant level irrespective of the frame number.

In addition, it is apparent from FIG. 4 that, when the gap is set at 3 μm or below, occurrences of image lags after one frame can be reduced to almost zero.

The extents of image-lag occurrences in the organic photoelectric conversion devices as shown in FIG. 5 wherein settings on the gap between adjacent pixel electrodes are changed to 6 μm, 4.5 μm, 3 μm and 1.5 μm, respectively, are compared to one another. It is apparent from these comparisons that image-lag occurrence is perceived on the 1st to 4th frames in the cases of setting the gap at 6 μm and 4.5 μm, respectively, but in the cases of setting the gap at 3 μm and 1.5 μm, respectively, image-lag occurrence can be reduced to a practically insignificant level irrespective of the frame number.

Additionally, it is apparent from FIG. 6 that, when the gap is set at 3 μm or below, occurrences of image lags after one frame can be reduced to almost zero.

The extents of image-lag occurrences in the organic photoelectric conversion devices as shown in FIG. 7 wherein settings on the gap between adjacent pixel electrodes are changed to 5.5 μm, 4 μm, 3 μm and 2.5 μm, respectively, are compared to one another. It is apparent from these comparisons that image-lag occurrence is perceived on 1st to 4th frames in the cases of setting the gap at 5.5 μm and 4 μm, respectively, but in the cases of setting the gap at 3 μm and 2.5 μm, respectively, image-lag occurrence can be reduced to a practically insignificant level irrespective of the frame number.

Additionally, it is apparent from FIG. 8 that, when the gap is set at 3 μm or below, occurrences of image lags after one frame can be reduced to almost zero.

Thus, it is shown that, when the gap between adjacent pixel electrodes is set at 3 μm or below in the makeup using each individual photoelectric conversion material (merocyanine, phthalocyanine or 4H-pyran) for the organic photoelectric conversion layer, image lags can be reduced to an insignificant level irrespective of the photoelectric conversion material used, whereas occurrence of image lags becomes conspicuous when the gap is set at 4 μm or above.

Next image-lag measurements are performed on frames in the cases of making changes in area of each pixel electrode and voltage applied to the counter electrode. In these measurements, merocyanine is used as the photoelectric conversion material.

Figure 9:
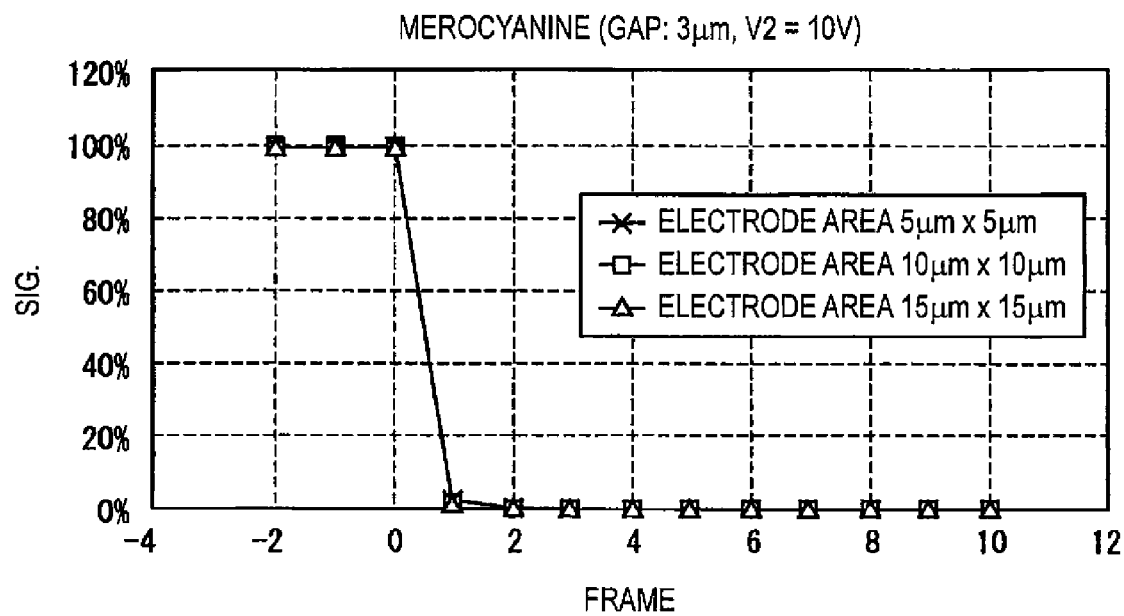
FIG. 9 is a graph showing a correlation of the proportion of image-lag occurrence with the frame number in each of the cases of making changes in area of each pixel electrode.

FIG. 9 is a graph showing a correlation of the proportion of image-lag occurrence with the frame number in each of the cases of making changes in area of each pixel electrode. Herein, correlations in the cases where the devices are configured to have pixel electrode areas of 5 μm×5 μm, 10 μm×10 μm and 15 μm×15 μm, respectively, are determined. In determining such correlations, the gap between adjacent pixel electrodes is fixed at 3 μm and the voltage applied to the counter electrode at 10V. The result of these experiments shows that, when the gap between adjacent pixel electrodes is fixed at 3 μm, image lags occurring in relation to each frame number can be prevented irrespective of the pixel electrode area.

Figure 10:
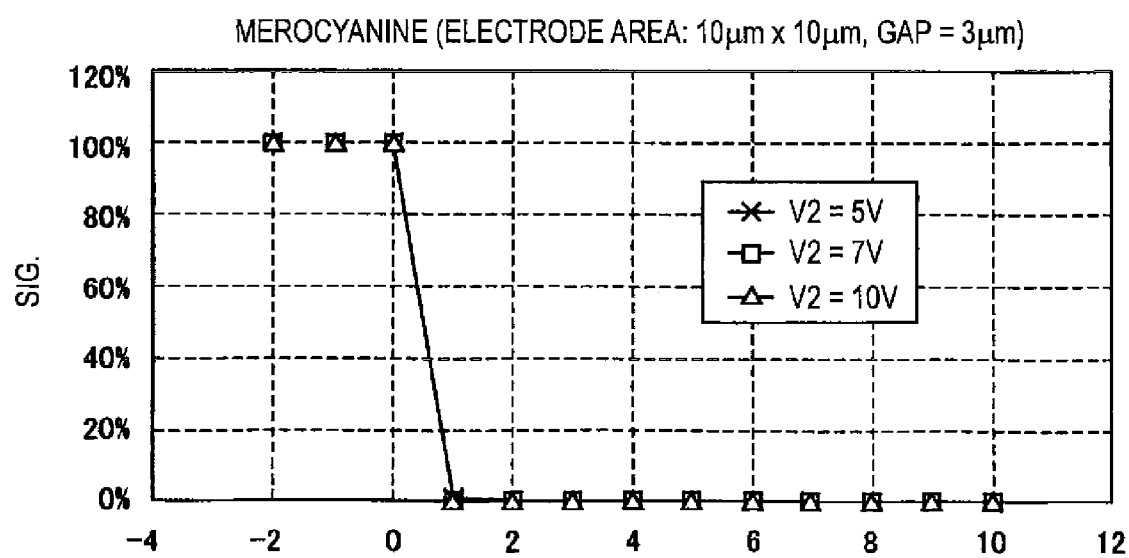
FIG. 10 is a graph showing a correlation of the proportion of image-lag occurrence with the frame number in each of the cases of making changes in voltage applied to the counter electrode.

FIG. 10 is a graph showing a correlation of the proportion of image-lag occurrence with the frame number in each of the cases of making changes in voltage applied to the counter electrode. Herein, correlations in the cases where the devices are configured to have counter electrode voltage (V2) of 5V, 7V and 10V, respectively, are determined. In determining such correlations, the gap between adjacent pixel electrodes is fixed at 3 μm and the area of each pixel electrode at 10 μm×10 μm. The result of these experiments shows that, when the gap between adjacent pixel electrodes is fixed at 3 μm, image lags occurring in relation to each frame number can be prevented irrespective of the voltage applied to the counter electrode.

When those experiments are checked, image lags occurring in an organic photoelectric conversion device turn out to be sensitive to the gap between adjacent pixel electrodes but independent of the area of each pixel electrode and the voltage applied to the counter electrode. More specifically, occurrence of image lags can be prevented by fixing the gas between adjacent pixel electrodes at 3 μm or below, irrespective of the area of each pixel electrode and the voltage applied to the counter electrode.

Since the organic photoelectric conversion devices relating to the invention are configured to have a gap of 3 μm or below between every adjacent pair of pixel electrodes, image lags can be prevented from occurring in them, and besides, as signal charges generated in their individual organic photoelectric conversion layers can be prevented from remaining in the films, efficient readout of signal charges becomes feasible.

What is claimed is:

1. An organic photoelectric conversion device comprising:
   an organic photoelectric conversion layer that performs photoelectric conversion of incident light and generates a signal charge;
   a first electrode provided on one side of the organic photoelectric conversion layer and
   a plurality of second electrodes arranged on the other side of the organic photoelectric conversion layer,
   wherein a gap between an adjacent pair of the second electrodes is 3 μm or below.

2. The organic photoelectric conversion device according to claim 1, wherein the first electrode is configured as a single counter electrode having optical transparency.

3. The organic photoelectric conversion device according to claim 1, wherein the plurality of second electrodes are pixel electrodes arranged corresponding to respective pixel-regions.

4. The organic photoelectric conversion device according to claim 1, wherein the second electrodes are connected to a readout circuit for reading the signal charge and transmitting the signal charge to an output section.

* * * * *